United States Patent [19]

Pearson et al.

[11] 4,328,045
[45] May 4, 1982

[54] HEAT TREATED SINGLE CRYSTAL ARTICLES AND PROCESS

[75] Inventors: David D. Pearson, West Hartford; Frank D. Lemkey, Glastonbury; Bernard H. Kear, Madison, all of Conn.

[73] Assignee: United Technologies Corporation, Hartford, Conn.

[21] Appl. No.: 177,047

[22] Filed: Aug. 11, 1980

Related U.S. Application Data

[63] Continuation-in-part of Ser. No. 973,193, Dec. 26, 1978, abandoned, which is a continuation-in-part of Ser. No. 913,131, Jun. 6, 1978, abandoned.

[51] Int. Cl.$^3$ ............................................. C22F 1/10
[52] U.S. Cl. ........................................ 148/3; 148/162; 148/404
[58] Field of Search ............... 148/2, 3, 162, 32, 32.5; 15/170

[56] References Cited

U.S. PATENT DOCUMENTS

| | | | |
|---|---|---|---|
| 3,617,397 | 11/1971 | Maxwell | 148/32.5 |
| 3,642,543 | 2/1972 | Owczarski | 148/162 |
| 3,655,462 | 4/1972 | Maxwell | 148/32.5 |
| 3,668,023 | 6/1972 | Kotval | 148/162 X |
| 3,802,938 | 4/1974 | Collins et al. | 148/11.5 P |
| 3,904,403 | 9/1975 | Komatsu et al. | 148/32.5 |
| 3,933,483 | 1/1976 | Komatsu et al. | 148/32.5 X |
| 4,012,241 | 3/1977 | Lemkey | 148/32.5 |
| 4,092,183 | 5/1978 | Grundy | 148/32 |
| 4,116,723 | 9/1978 | Gell et al. | 148/162X |

Primary Examiner—Peter K. Skiff
Attorney, Agent, or Firm—Charles E. Sohl

[57] ABSTRACT

An alloy composition coasting scheme and specific heat treatment process are described for the production of directionally solidified single crystal articles which have exceptional properties. The alloy is based on the Ni-Al-Mo system, preferably with additions of Ta. The process for producing the article inclused directional solidification at a high rate to produce a fine dendritic microstructure. A combined homogenizing and solution treatment is performed to provide a unique chemically homogeneous single phase microstructure. This homogeneous article is rapidly quenched and then aged at an intermediate temperature to develop a controlled uniform distribution of fine gamma prime phase particles.

6 Claims, 6 Drawing Figures

HEAT TREATED SINGLE CRYSTAL ARTICLES AND PROCESS

CROSS REFERENCE TO RELATED APPLICATIONS

This application is a continuation-in-part of application U.S. Ser. No. 973,193 filed Dec. 26, 1978 now abandoned which in turn is a continuation-in-part of application U.S. Ser. No. 913,131 filed June 6, 1978 now abandoned.

DESCRIPTION

Technical Field

This invention relates to the field of nickel base superalloys and processes to produce high strength heat resistant single crystal articles by directional solidification and heat treatment.

Background Art

U.S. Pat. No. 3,260,505 to Ver Snyder describes directionally solidified articles and methods for producing them. U.S. Pat. No. 3,494,709 to Piearcey describes single crystal superalloy articles and methods for producing them. U.S. Pat. No. 3,915,761 to Tschinkel et al describes directionally solidified articles which have a refined microstructure as a result of rapid solidification. U.S. Pat. No. 4,116,723 by Gell et al describes a class of single crystal materials which may be homogenized.

U.S. Pat. No. 2,542,962 to Kinsey describes a broad class of compositions including some in the Ni-Mo-Al system. U.S. Pat. No. 3,617,397 to Maxwell describes a specific Ni-Mo-Al composition having exceptional properties. U.S. Pat. No. 3,904,403 to Komatsu describes alloys in the Ni-Mo-Al system and discusses directional solidification of these alloys. U.S. Pat. Nos. 4,012,241 and 4,111,723 by Lemkey describe Ni-Mo-Al eutectics for directional solidification.

DISCLOSURE OF INVENTION

A particular alloy composition is directionally solidified to produce cast single crystal articles. The solidified articles are then heat treated under conditions which produce a homogeneous gamma single phase solid solution. Chemical homogeneity as well as phase homogeneity is achieved. The homogeneous article is rapidly cooled from the heat treatment temperature so as to effectively maintain the single phase structure at lower temperatures. Finally, the single crystal is aged at a moderately high temperature to produce a refined distribution of the gamma prime strengthening phase. As an alternative, plane front solidification may be employed to suppress dendrite formation and this will eliminate the need for the solution heat treatment.

The foregoing and other objects, features and advantages of the present invention will become more apparent in the light of the following detailed description of preferred embodiments thereof.

BEST MODE FOR CARRYING OUT THE INVENTION

Unless otherwise noted, all percentages listed herein are weight percentages.

This invention relates to an alloy composition and processing sequence which can be combined to produce single crystal articles having exceptional high temperature mechanical properties.

1. Alloy Composition

The basic alloy is a comparatively simple one which is based on the Ni-Al-Mo system. The broad and preferred composition ranges are shown in Table 1.

TABLE 1

|  |  | Weight % | | Atomic % | |
|---|---|---|---|---|---|
|  |  | Al | Mo | Al | Mo |
| Broad | A | 9.0 | 4.0 | 18 | 2.3 |
|  | B | 8 | 18.0 | 17 | 10.8 |
|  | C | 3.4 | 30.2 | 8 | 20.0 |
|  | D | 3.5 | 23.3 | 8 | 15.0 |
| Preferred | E | 8.3 | 10.4 | 17 | 6.0 |
|  | F | 8.2 | 12 | 17 | 7.0 |
|  | G | 6 | 16.5 | 13 | 10.0 |
|  | H | 6 | 18 | 13 | 11.0 |

Figure 1:
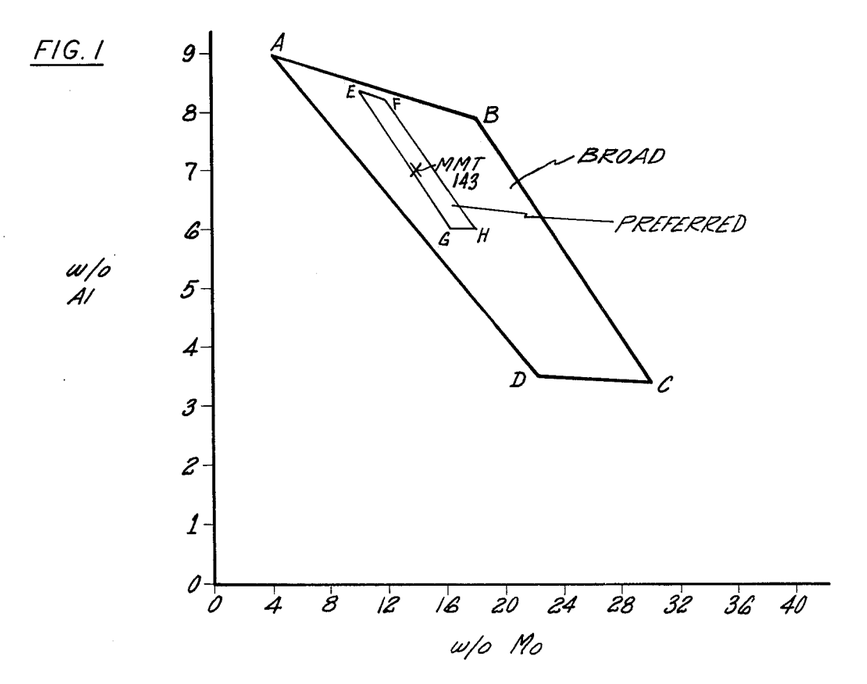
FIG. 1 is a plot showing the broad and preferred Al and Mo contents.

The information in Table 1 is also shown in FIG. 1. As indicated below, Ta can be substituted for Al on an atomic basis. Thus the scale labeled Al can also be used to indicate Al+Ta levels by the appropriate conversions which are familiar to those skilled in the art. Compositions above line segment A-B cannot be homogenized while compositions to the right of line segment B-C contain free Mo and have low mechanical properties. The solvus line between alloys which do not contain free Mo and those which do lies near line B-C. The best properties are obtained for alloys very close to this solvus but to the left of it. The preferred composition range shows those alloys which meet this criteria.

These ranges overlap certain other alloys, in particular, the alloy disclosed in U.S. Pat. Nos. 3,655,462; 4,012,241, and 4,111,723. The present invention, however, achieves unexpected mechanical properties through the combination of the alloy and the processing sequence employed. The basic ternary alloy has good short-term mechanical properties at elevated temperatures but suffers from microstructural instabilities which may cause a deterioration in mechanical properties. These instabilities include the formation of massive gamma prime phase particles at grain boundaries after extended exposure to elevated temperatures which lead to mechanical at the grain boundaries. However, for certain applications, this basic alloy may be adequate. The addition of Ta to the alloy in amounts of up to about 12 weight % stabilizes the gamma prime phase against coarsening and greatly improves the long term mechanical properties. Ta is a relatively dense element and its incorporation into the alloy raises the alloy density, consequently a preferred Ta range is from about 4 to 10%. Ta substitutes for Al and when Ta is added to the alloy, the Al content should be reduced in proportion to the atomic percent of Ta added so that the atomic amounts of Ta and Al fall within the limits shown in Table 1 and FIG. 1.

The major phases present in alloys of this composition are the gamma and gamma prime phases. The gamma phase (nickel solid solution) is the matrix phase in which are found discrete particles of the gamma prime phase ($Ni_3Al$), about 40–70 percent, by volume.

The alloys are characterized by having a gamma prime solvus temperature above which the gamma prime phase dissolves into the gamma phase. The gamma prime solvus temperature will range from 2320°–2440° F. The solidus and liquidus temperatures for these alloys are close together and range from about 2350°–2470° F. The solidus temperature exceeds the gamma prime solvus temperature so that the alloy may be solution treated without incipient melting and consequent degradation in properties.

Carbon is deleterious since carbides are nucleation sites for cavity formation in creep and crack initiation in fatigue. In addition, it is a melting point depressant which will make heat treatment more difficult and will indirectly have an adverse effect on the final mechanical properties. The carbon content is preferably limited to less than 100 ppm and preferably less than 50 ppm.

Up to about 6% Cb, 6% Ti, and 6% V and mixtures may also be substituted for Al on an equiatomic basis and may be used with Ta. The sum of Ta, Cb, Ti and V should not exceed about half of the nominal Al on an atomic basis. Likewise, up to about half of the Mo may be replaced by an equiatomic amount of W or Re. For certain applications, up to 10% Cr and up to 5% Co might be added, however, large quantities of these elements may promote deleterious phases.

2. Solidification

Two directional solidification techniques may be employed, dendritic and plane front. Dendritic solidification is the normal superalloy directional solidification technique and is described, with reference to single crystals, in U.S. Pat. No. 3,494,709 which is incorporated herein by reference. Dendritic growth occurs under conditions of moderate growth rates (rate of motion of solid-liquid interface) and moderate thermal gradient (temperature gradient at the solid-liquid interface). Successful dendritic solidification has been achieved for G/R values as low as 24° F. in. $^{-2}$ hr. for the alloys discussed herein.

The dendritic solidification process occurs over a range of temperatures and the first material to freeze forms as protrusions from the solid into the liquid which are termed dendrites. The liquid between the dendrites subsequently freezes. The dendrites and the liquid between the dendrites are of different compositions and the possibility of achieving homogenization by diffusion in a reasonable time is governed by the dendrite spacing and the alloys solidus temperature. Experimentally, the square of the dendrite spacing is found to be inversely proportional to the rate of motion of the solid-liquid interface in a constant thermal gradient. At a particular solutionizing temperature, the time required to reach a given level of homogeneity is proportional to the square of the distance between the dendrites. From these relationships, it appears that the time required for homogenization after dendritic solidification is inversely proportional to the freezing velocity. For the alloys in question, which can be homogenized at high temperatures because of their high solidus temperature, material which has been dendritically solidified at a rate of 10 inches per hour can be effectively homogenized in about 10 hours, while material solidified at 5 inches per hour will require about 20 hours to achieve an equal degree of homogenization. Twenty hours is approximately the upper time limit for economic homogenization, accordingly, it is preferred that the rate of solidification (i.e., the rate of motion of the solid-liquid interface) exceed about 5 inches per hour.

In the case of plane front solidification, dendrite formation is suppressed by the use of an extremely high gradient and a very low growth rate. For the alloys described herein it would appear that gradients on the order of 500° F./in. in combination with rates on the order of 0.15 in./hr. would be necessary.

The benefit of plane front solidification is that microsegregation, especially of the refractory metals, is effectively eliminated, thus the subsequent heat treatment used can be greatly shortened since only dissolution of the gamma prime phase need be achieved. This benefit must be balanced against the much longer solidification time required.

3. Homogenization/Solutionizing

The composition of the present invention derives its exceptional properties largely as a result of being nearly saturated with refractory metals. The closer the alloy is to saturation the better will be its properties. However, refractory metal contents in excess of saturation leads to the formation of extraneous undesired phases rich in refractory metals, which are highly detrimental to mechanical properties, especially ductility.

Nickel composition alloys such as those of the present invention solidify dendritically as described in the previous section. The result is that the solidified alloys are chemically inhomogeneous and the regions of chemical inhomogeneity are related to the prior cast dentrite spacing. The interdendrite regions are rich in refractory metals. In the prior art it is known to homogenize superalloys for the purpose of developing a refined gamma prime structure. The gamma prime phase is a composition having the general formula: $Ni_3(Al,Ti)$. To homogenize most alloys for purpose of gamma prime control one needs to develop relatively uniform aluminum and titanium distribution. This is not too difficult to achieve since aluminum and titanium are atoms which diffuse rather quickly in nickel at elevated temperature. Molybdenum and other refractory metals diffuse quite slowly relative to aluminum and titanium and the heat treatment selected to achieve chemical homogeneity with respect to aluminum and titanium will not achieve chemical homogeneity with respect to the refractory metals.

For the compositions of the present invention in which homogeneity of refractory metals must be achieved, the time to reduce the segregation level of the refractory elements to 1% of its initial value is given by the following formula:

$$t_{.01} = \frac{.12\lambda^2}{D}$$

In this formula $\lambda$ is the wavelength of the segregation or the cast dendrite spacing which is typically 0.025 cm and D is the diffusity of the refractory elements at the heat treatment temperature. D for molybdenum in nickel is given by the following formula:

$$D = .86 \exp\left\{\frac{-64{,}400}{2T}\right\}, \quad T = \text{temperature, °K.}$$

For the composition of the present invention, within this λ (which is typical), a 99% reduction in segregation can be achieved with a 16-hour heat treatment at 2400° F. Using the more typical heat treatment time of 4 hours would give only a 70% reduction in segregation. The heat treatment range for these alloys is 2380°–2410° F., that being the gamma prime solvus and incipient melting point respectively.

For superalloys in general the following relationship is observed:

$$\lambda^2 G^4 V = \text{constant}$$

where λ is the dendrite spacing, G is the thermal gradient and V is the freezing velocity. Thus for a constant thermal gradient, λ will be proportional to the square root of the freezing velocity. Thus a variation in freezing velocity will have a lesser effect on dendrite spacing. Combining these equations with experimental observation leads to the practical guideline that the time required for effective homogenization with respect to refractory metals is approximately 50 divided by the freezing velocity in inches per hour.

Figure 6:
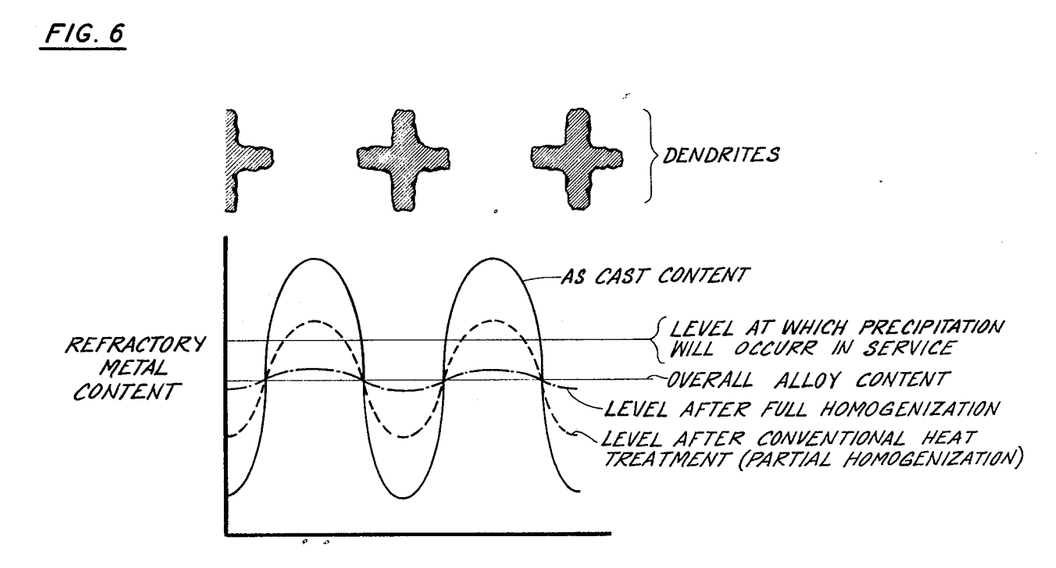
FIG. 6 shows how the refractory metal content varies after certain heat treatments.

FIG. 6 shows the solutionize homogenization step in schematic form. The alloy has an overall or average refractory metal content which is near, but below the level at which precipitation of refractory rich phases will occur. In the material as cast the interdendritic regions are rich in refractory metal, and contain refractory metal in an amount much greater than the level which will cause precipitation of undesirable refractory rich phases in service. Thus, after some period of service, this undesirable precipitation will occur in the interdendrite regions, unless preventive measures are taken.

A conventional solution heat treatment (for example 4 hours) will reduce the refractory metal peak segregation level significantly but will not completely reduce the level to below the precipitation level.

Only a longer, more complete treatment will homogenize the composition to a point where the refractory level is lower than that which will cause precipitation, everywhere throughout the alloy. In general a reduction of at least about 90% in the as cast refractory segregation will be required. Of course, the closer the overall alloy refractory content is to the precipitation level the greater will be the amount of homogenization required to avoid precipitation.

As indicated, failure to achieve essentially complete homogenization, with respect to refractory content, will result in formation of refractory rich compounds such as δ, NiMo in service with detrimental effects on ductility.

4. Cooling

As a final step in the heat treatment process, it is necessary that the article be cooled at a rapid rate to a low temperature, e.g., 500° F. By rapid cooling, significant growth of the gamma prime phase can be avoided. By suppressing the formation of massive gamma prime phase particles, the possibility of subsequent controlled growth of the gamma prime phase is provided.

It is preferred that the cooling be performed at a rate equal to or in excess of the cooling which would be obtained by cooling the article in still air at room temperature, although more rapid cooling may be beneficial. It has been found to be possible to water quench Ni-Al-Mo-Ta single crystals from 2400° F. without cracking. After the cooling step, the article will be supersaturated in the refractory metals. It is virtually impossible to completely suppress the nucleation of the gamma prime phase, however, the amount of gamma prime phase will be less than the equilibrium amount of gamma prime.

5. Aging

The supersaturated article thus produced is reheated to a temperature between about 1500° F. and 2100° F. for a period of time sufficient to permit the controlled growth of the gamma prime phase (i.e., 1–20 hours). The aging step may be conveniently combined with other processing steps such as coating.

It is experimentally observed that the gamma prime phase formed during the aging step is extremely stable and resists coarsening even after long time exposures at elevated temperatures. Compositional homogeneity is important if the gamma prime particles are to be uniformly resistant to coarsening. In the absence of compositional homogeneity, localized coarsening may occur resulting in zones of weakness which will limit the properties of the article.

6. Article Properties

The resultant articles have unique and useful properties. The article has an extreme degree of chemical homogeneity on a scale at least as fine as the gamma prime particle size. The gamma prime phase is thermally stable. After aging, the article contains dislocation networks which surround the gamma prime particles and it appears likely that these dislocation networks are in part responsible for the low creep rates observed. Finally, the article is supersaturated in refractory metals and this supersaturation in these strengthening elements probably accounts for a large part of the superior mechanical properties observed.

An alloy composition falling within the limits previously described was tested under a variety of conditions. This alloy is referred to as MMT 143 and contains 5.8% Al, 14.3% Mo, 6% Ta, balance Ni. As a comparison, single crystal samples of alloy MAR M 200 were also tested. This alloy contains 9 Cr, 5 Al, 2 Ti, 12.5 W, 1 Cb, balance Ni. The MMT 143 samples were dendritically solidified at 10 inches per hour, solution treated at 2370° F. for 10 hours and aged at 1975° F. for 4 hours and 1600° F. for 24 hours.

These single crystal samples were prepared with different crystal orientations including [100], [110], and [111]. As will be seen from the results the [111] orientation is preferred. Best results were obtained for crystals oriented so that the major stress axis was within about 5° of a [111] crystal axis.

Figure 2:
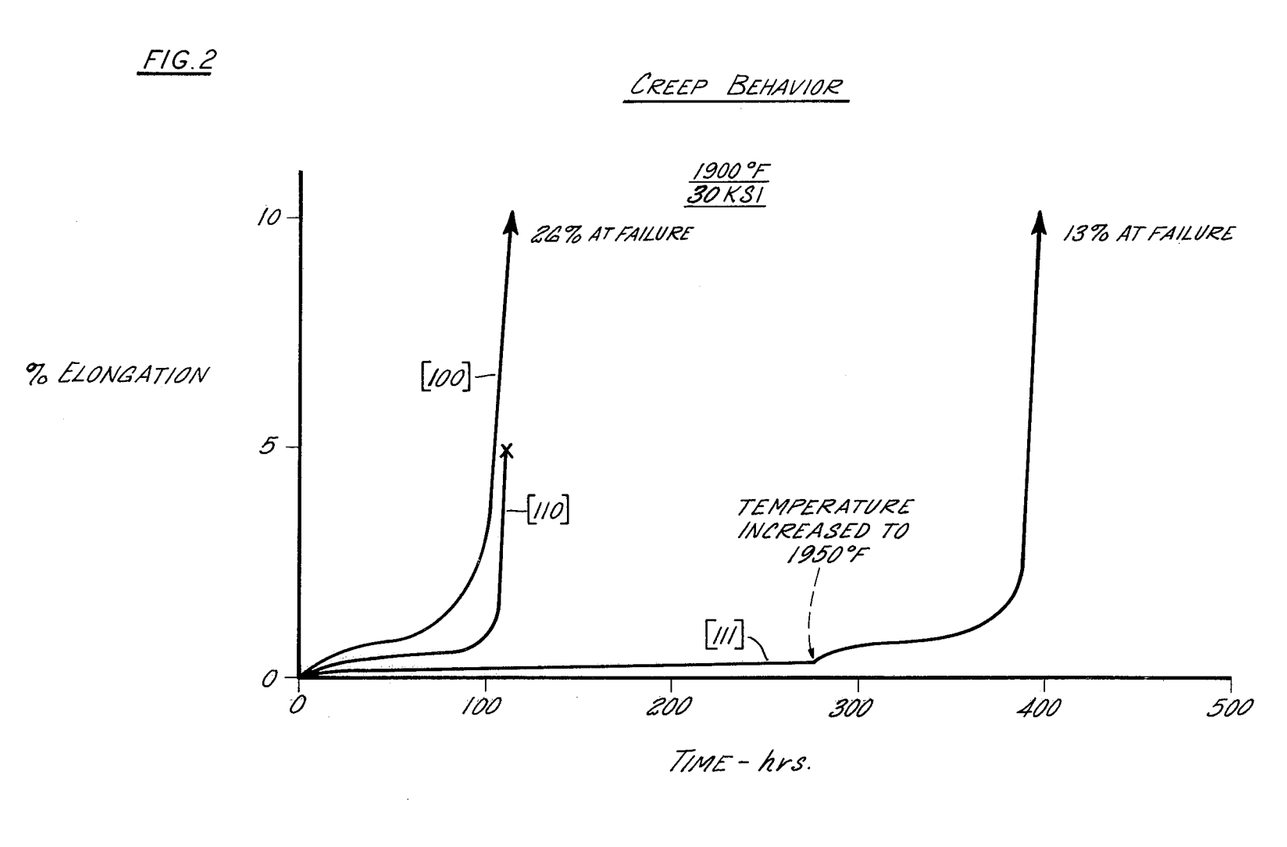
FIG. 2 shows the creep properties of the invention articles as a function of crystallographic orientation.

FIG. 2 depicts the creep behavior of the invention articles (MMT 143) at 1900° F./30 KSI as a function of crystallographic orientation. The [100] orientation and [110] orientation samples both failed in about 110 hours with the [100] orientation displaying greater ductility (26%) than the [100] (5%) orientation. The [111] orientation displayed the most interesting behavior. In order to complete the [111] test in a reasonable time the test temperature was increased to 1950° F. after 275 hours at 1900° F. Even after this increase in temperature an additional 125 hours (400 hours total) was required to cause failure. The elongation at failure, 13% indicates useful ductility. Subsequently, another [111] MMT 143 sample was tested to failure at 1900° F./30 KSI. The life to failure was 1080 hours and the elongation at failure was about 12%.

The [111] sample also showed an exceptionally low minimum steady state creep rate of about $9 \times 10^{-6}$ in./in./hr. So far as is known, no other metallic material has shown such a low creep rate under such severe test conditions. The steady state creep rates of the [100] and [110] orientations were about $1.1 \times 10^{-4}$ and $3 \times 10^{-5}$ in./in./hr. respectively. While these rates are low, and superior to the creep rates of most other known superalloys, they are not as impressive as the creep rate of the [111] orientation.

This property anisotropy at 1900° F. as a function of orientation is novel and completely unexpected. In the prior art, investigation of conventional nickel superalloys (esp. MAR M 200) has shown a marked property anisotropy at low and moderate temperatures e.g. 1200°–1400° F. but this anisotropy was not observed at higher temperatures e.g. 1700° F. and up. Thus the invention articles are novel in processing significant anisotropy at 1900° F. (i.e. the [111] orientation would last nine times longer at 1900° F. than would the [100] orientation) as shown in FIG. 2.

These creep curves also display another unique and beneficial property of the invention articles. The articles do not appear to undergo significant primary creep prior to the onset of secondary creep. This is important and beneficial in that the alloys very quickly reach a very stable and low deformation rate after they are placed in test (or in service). The substantial absence of primary creep is consistent with and has been interpreted by electron microscope observations. In conventional superalloys, second stage creep is characterized by the presence of dislocation networks. These networks form (in conventional superalloys) during primary creep and once formed serve as an impediment to further dislocation motion. In the invention articles, similar networks are observed, at the gamma-gamma prime interfaces, after cooling from the solution/homogenizing treatment and subsequent heat treatment (1975° F./4 hrs.). The networks thus formed are believed to act in the same way as those formed during primary creep in conventional superalloys. Thus the invention alloys essentially bypass first stage creep by forming dislocation networks during heat treatment.

By way of comparison, [100] single crystals of MAR M 200 tested under the same conditions typically fail in about 15 hours so that in the [100] orientation the invention articles have a $8 \times$ life advantage.

Figure 3:
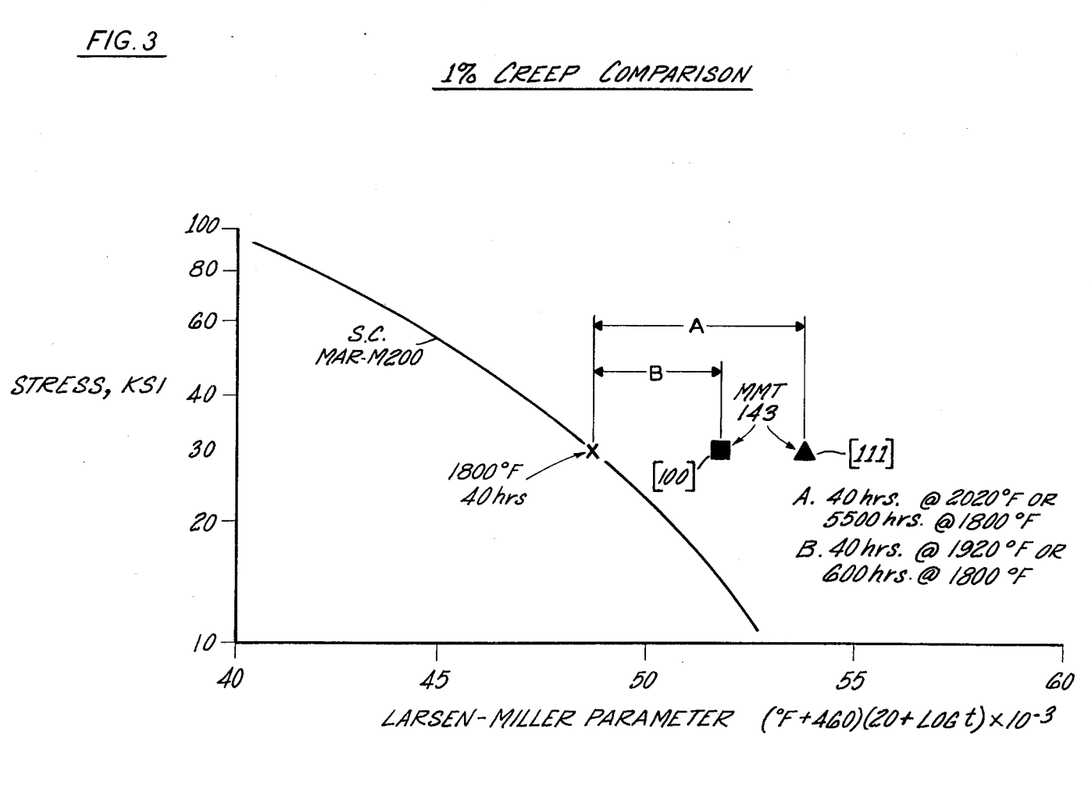
FIG. 3 shows a Larsen-Miller parameter comparison (1% creep) for the invention articles and prior art single crystals.

FIG. 3 shows a Larsen-Miller plot of stress required to reach 1% creep for different combinations of time and temperature. A curve is shown for the prior art single crystal MAR M 200 composition of [100] orientation. Also shown are two data points for the invention article (MMT 143). The tests which produced these data points were performed at 30 KSI. At 1800° F. and 30 KSI load, the S.C. MAR M 200 underwent 1% creep in 40 hours. Under the same temperature and stress condition the [100] MMT 143 would require 5500 hours to undergo 1% creep (an improvement of 135 times) or alternatively would undergo 1% creep in 40 hours at the much higher temperature of 2020° F. (a temperature improvement of 220° F.). The [100] MMT would require 600 hours to fail at 1800° F. (an improvement of 150 times) or would fail in 40 hours at the higher temperature of 1920° F. (a temperature improvement of 120° F.). Both of these results are very much better than the prior art and demonstrate the marked potential advantage of the invention articles.

Figure 4:
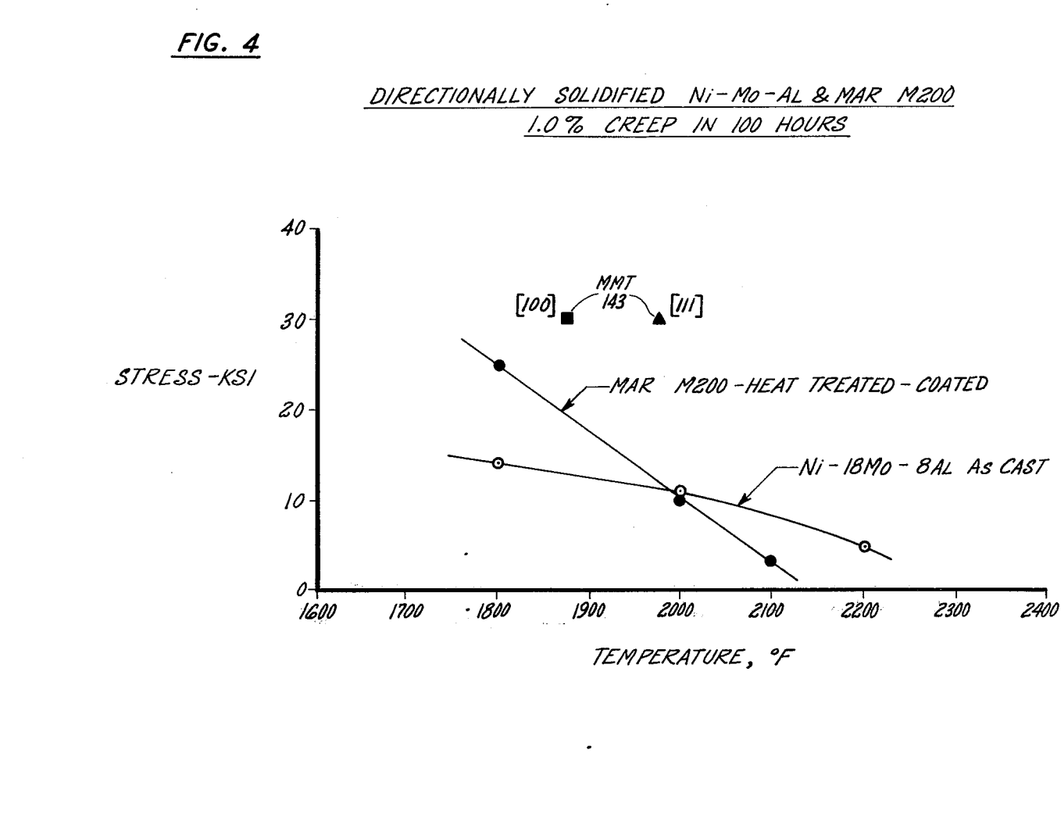
FIG. 4 shows the stress required to produce 1% creep in 100 hours as a function of temperature for the invention articles and two prior art articles.

FIG. 4 shows the stress required to produce 1% creep in 100 hours as a function of temperature for the invention and some prior art articles. This figure is taken from U.S. Pat. No. 3,617,397 (except for the invention data). The MAR M 200 alloy has previously been described and the Ni-Mo-Al alloy contains 18% Mo and 8% Al and was directionally solidified but not heat treated. The superiority of the invention articles is clearly evident. The invention articles require about $2.5 \times$ as much stress as do the nonheat treated Ni-Al-Mo alloys to achieve 1% creep. This is a clear indication of the significance of the processing sequence used to produce the invention articles.

Figure 5:
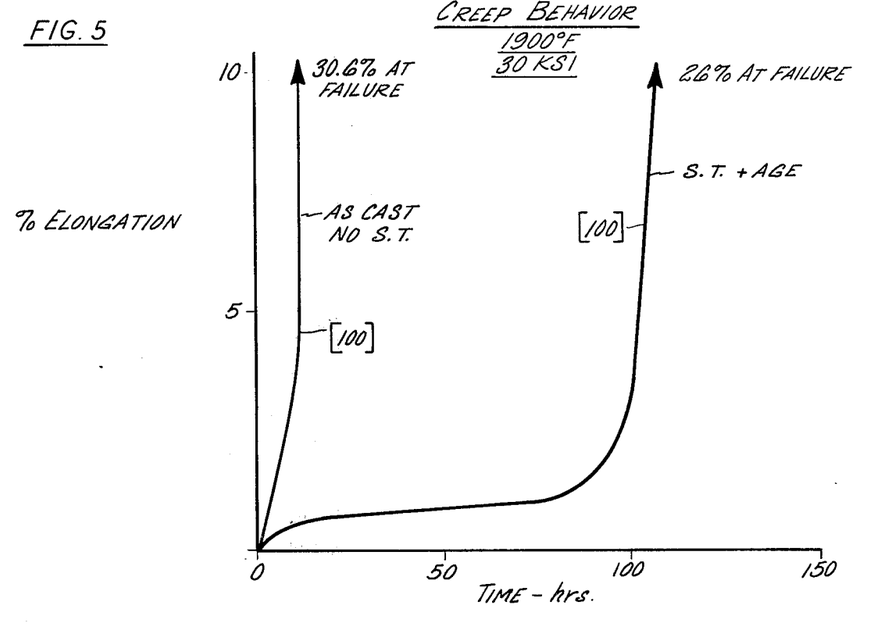
FIG. 5 shows the creep behavior of the present material with and without heat treatment.

FIG. 5 illustrates the importance of the solution treatment. The samples in FIG. 5 were of MMT 143 composition and [100] orientation. The curve labeled "S.T. + Age" shows the creep behavior of a sample solution treated at 2370° F., quenched, aged at 1975° F. for 4 hours and then 1600° F. for 24 hours. The curve labeled "As Cast No S.T." shows the behavior of a sample which was not solution treated. The difference in behavior is striking and clearly shows the necessity of the solution treatment.

The solution treated sample in FIG. 5 had been solution treated for 10 hours. Samples treated at the same temperature for 4 hours and 20 hours displayed very similar behavior.

A sample which had been solution treated but not aged was also tested in creep at 1900° F. and 30 KSI and its steady state creep rate was determined to be $8 \times 10^{-5}$ inch/inch/hour.

Although this invention has been shown and described with respect to a preferred embodiment thereof, it should be understood by those skilled in the art that various changes and omissions in the form and detail thereof may be made therein without departing from the spirit and scope of the invention.

We claim:
1. A method for producing a high strength superalloy article including the steps of:
   a. providing a molten alloy of a composition falling within points A-B-C-D of FIG. 1, said composition being essentially saturated with respect to refractory metal content;
   b. directionally solidifying the alloy at a rate of at least 5 inches/hr., in a gradient which is steep enough to permit dendritic solidification, to provide a single crystal with a refined cast microstructure consisting mainly of gamma prime particles in a gamma matrix and containing dendrites which are low in refractory metal content and interdendrite regions which are high in refractory metal content;
   c. homogenizing and solutionizing the cast article at a temperature above the gamma prime solvus and near but below the solidus for a period of time sufficient to dissolve the gamma prime phase and homogenize the microstructure with respect to refractory metal content, reducing the degree of refractory metal segregation by at least about 90%;
   d. cooling the microstructure at a rate which is sufficient to substantially suppress the reprecipitation of the gamma prime phase and to provide a micro- structure which is supersaturated with refractory elements; and e. aging the article at a temperature between 1500° and 2100° F. to reprecipitate the gamma prime phase on a fine scale;

whereby the heat treated alloy will not develop refractory metal rich embrittling phases in service under conditions of elevated temperature and whereby an alloy of 5.8 wt. % Al, 14.3 wt. % Mo, 6 wt. % Ta, balance Ni will exhibit a time to 1% creep at 1800° F./30 Ksi of about 600 hours in the [100] orientation.

2. A method for producing a high strength superalloy article including the steps of:
   a. providing a molten alloy of a composition falling within points A-B-C-D of FIG. 1, said composition being essentially saturated with respect to refractory metal content;
   b. directionally solidifying the alloy at a rate of less than 0.15 inches/hr., in a gradient which is steep enough to permit plane front solidification, to provide a single crystal with a refined cast microstructure consisting mainly of gamma prime particles in a gamma matrix, said microstructure being free from dendrites;
   c. solutionizing the cast article at a temperature above the gamma prime solvus and near the solidus for a period of time sufficient to dissolve the gamma prime phase;
   d. cooling the microstructure at a rate which is sufficient to substantially suppress the reprecipitation of the gamma prime phase and to provide a microstructure which is supersaturated with refractory elements; and
   e. aging the article at a temperature between 1500° and 2100° F. to reprecipitate the gamma prime phase on a fine scale;

whereby the heat treated alloy will not develop refractory metal rich embrittling phases in service under conditions of elevated temperature and whereby an alloy of 5.8 wt. % Al, 14.3 wt. % Mo, 6 wt. % Ta, balance Ni will exhibit a time to 1% creep at 1800° F./30 Ksi of about 600 hours in the [100] orientation.

3. A method as in claims 1 and 2 wherein the alloy contains up to about 12% Ta as a partial equiatomic replacement for Al.

4. A method as in claims 1 and 2 wherein the alloy composition falls within the points E-F-G-H of FIG. 1.

5. A method as in claims 1 and 2 wherein up to about one half of the Al content is replaced by an element selected from the group consisting of Ta, Cb, Ti, V and mixtures thereof.

6. A method as in claims 1 and 2 wherein up to about half of the Mo content is replaced by an element selected from the group consisting of W and Re and mixtures thereof.

* * * * *